(12) United States Patent
Nishioka et al.

(10) Patent No.: US 11,094,747 B2
(45) Date of Patent: Aug. 17, 2021

(54) ORGANIC ELECTROLUMINESCENT DISPLAY APPARATUS

(71) Applicant: Sakai Display Products Corporation, Sakai (JP)

(72) Inventors: Yukiya Nishioka, Osaka (JP); Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 16/823,277

(22) Filed: Mar. 18, 2020

(65) Prior Publication Data
US 2020/0219942 A1 Jul. 9, 2020

Related U.S. Application Data

(63) Continuation of application No. 16/076,143, filed as application No. PCT/JP2017/046470 on Dec. 25, 2017, now Pat. No. 10,636,845.

(51) Int. Cl.
*H01L 27/32* (2006.01)

(52) U.S. Cl.
CPC ...... *H01L 27/3211* (2013.01); *H01L 27/3246* (2013.01)

(58) Field of Classification Search
CPC . H01L 27/3211; H01L 27/3246; H01L 51/50; H01L 27/32; H05B 33/22; H05B 33/12
See application file for complete search history.

(56) References Cited

U.S. PATENT DOCUMENTS

| 2001/0023661 A1 | 9/2001 | Hiroki et al. |
| 2009/0189517 A1 | 7/2009 | Choi et al. |
| 2010/0033084 A1 | 2/2010 | Ko et al. |

(Continued)

FOREIGN PATENT DOCUMENTS

| JP | 2006190570 A | 7/2006 |
| JP | 2008-204757 A | 9/2008 |

(Continued)

OTHER PUBLICATIONS

Decision to Grant for related Japanese Application No. 2018-527258 dated Jul. 3, 2018.

(Continued)

*Primary Examiner* — Julia Slutsker
(74) *Attorney, Agent, or Firm* — Renner, Otto, Boisselle & Sklar, LLP (57) ABSTRACT

An organic EL display apparatus (100) has a plurality of pixels including red pixels (R), green pixels (G) and blue pixels (B), the apparatus (100) including: a substrate (1); a plurality of organic EL elements (10) supported on the substrate, with one organic EL element provided in each pixel; a generally lattice-shaped first bank (21) defining the pixels, the first bank including a plurality of first portions (21A) extending in a first direction and a plurality of second portions (21B) extending in a second direction that crosses the first direction; and a plurality of second banks (22) provided on a top portion (21t) of the first bank, wherein the second banks are not formed at intersections (cr) between the first portions and the second portions of the first bank, and the second banks are more liquid repellent than the first bank.

12 Claims, 6 Drawing Sheets

(56) References Cited

U.S. PATENT DOCUMENTS

| | | |
|---|---|---|
| 2010/0207107 A1 | 8/2010 | Kim |
| 2012/0273804 A1 | 11/2012 | Hatano |
| 2012/0313844 A1 | 12/2012 | Im et al. |
| 2013/0248867 A1 | 9/2013 | Kim et al. |
| 2014/0091285 A1 | 4/2014 | Shin et al. |
| 2015/0044805 A1* | 2/2015 | Ishino ................ H01L 27/3209 438/46 |
| 2016/0118449 A1 | 4/2016 | Sato et al. |
| 2017/0133443 A1 | 5/2017 | Nendai |

FOREIGN PATENT DOCUMENTS

| | | |
|---|---|---|
| JP | 2009-181954 A | 8/2009 |
| JP | 2010-080310 A | 4/2010 |
| JP | 2012209095 A | 10/2012 |
| JP | 2014-072186 A | 4/2014 |
| JP | 2016-085913 A | 5/2016 |
| JP | 2016072118 A | 5/2016 |
| JP | 2016167526 A | 9/2016 |
| JP | 2016197612 A | 11/2016 |
| JP | 2017-091802 A | 5/2017 |
| JP | 2017-212082 A | 11/2017 |
| JP | 2017208348 A | 11/2017 |
| WO | WO 2009/151012 A1 | 12/2009 |

OTHER PUBLICATIONS

PCT International Search Report for related International Application No. PCT/JP2017/046470 dated Mar. 20, 2018.

Allowed claims of parent U.S. Appl. No. 16/076,143, filed Aug. 7, 2018.

* cited by examiner

ORGANIC ELECTROLUMINESCENT DISPLAY APPARATUS

TECHNICAL FIELD

The present invention relates to an organic EL display apparatus.

BACKGROUND ART

In recent years, organic EL (Electro Luminescence) display apparatuses have started to be in practical use. An organic EL display apparatus includes, for each pixel, at least one organic EL element (Organic Light Emitting Diode: OLED) and at least one TFT (Thin Film Transistor) for controlling the current flow supplied to the OLED. Each pixel is defined by a lattice-shaped structure formed from an insulating material (called "banks" or "partition walls"). Banks are provided on a flattening film that is formed so as to cover a circuit including TFTs (called a "driving circuit" or "backplane circuit") (see, for example, Patent Document No. 1).

An organic EL element of each pixel includes an anode that is connected to a driving circuit, an organic EL layer provided on the anode, and a cathode provided on the organic EL layer. An organic EL layer has a layered structure including a plurality of layers formed from an organic semiconductor material. For example, the layered structure includes a hole injection layer, a hole transport layer, a light emitting layer, an electron transport layer and an electron injection layer, in this order starting from the anode side. Organic EL layers of a red pixel, a green pixel and a blue pixel include a light emitting layer that emits red light, a light emitting layer that emits green light and a light emitting layer that emits blue light, respectively.

The organic EL layer is formed on an anode located in a region surrounded by banks (a region to be a pixel) by using a vacuum deposition method or a print method. That is, methods for forming an organic EL layer are generally classified into "deposition-based methods" and "print-based methods".

CITATION LIST

Patent Literature

Patent Document No. 1: Japanese Laid-Open Patent Publication No. 2016-85913

SUMMARY OF INVENTION

Technical Problem

With the increasing definition of organic EL display apparatuses, the occurrence of color mixture between red, green and blue is becoming pronounced. When color mixture occurs, the color purity of the displayed image lowers, resulting in a so-called "dull" image, significantly lowering the display quality.

A cause for the occurrence of color mixture is that when forming light emitting layers of different colors in corresponding pixels during a manufacturing process of an organic EL display apparatus, the light emitting layer materials of adjacent pixels contaminate each other, thereby lowering the single-color color purity of red, green and blue. Such a problem can arise both with print-based methods and with deposition-based methods.

The present invention has been made in view of the problem set forth above, and it is an object of the present invention to provide an organic EL display apparatus with which the occurrence of color mixture is suppressed and which can display an image with a high color purity.

Solution to Problem

An organic EL display apparatus according to an embodiment of the present invention is an organic EL display apparatus having a plurality of pixels including red pixels, green pixels and blue pixels, the apparatus including: a substrate; a plurality of organic EL elements supported on the substrate, with one organic EL element provided in each pixel; a generally lattice-shaped first bank defining the pixels, the first bank including a plurality of first portions extending in a first direction and a plurality of second portions extending in a second direction that crosses the first direction; and a plurality of second banks provided on a top portion of the first bank, wherein the plurality of second banks are not formed at intersections between the first portions and the second portions of the first bank, and the plurality of second banks are more liquid repellent than the first bank.

In one embodiment, the first bank includes a side surface having a tapered shape; and the plurality of second banks do not cover the side surface of the first bank.

In one embodiment, the plurality of second banks are colored.

In one embodiment, the first bank is formed from a non-fluorine non-silicone resin.

In one embodiment, the first bank is formed from an acrylic resin, a polyamide or a polyimide with photosensitivity.

In one embodiment, the plurality of second banks are formed from an acrylic resin or a polyamide with negative photosensitivity.

In one embodiment, the plurality of second banks include a liquid repellent material, or a liquid repellent treatment is performed on a surface thereof.

In one embodiment, the plurality of second banks include a second bank that is located between two adjacent pixels of different colors.

In one embodiment, the pixels are arranged so as to include two adjacent pixels of the same color; and the plurality of second banks include a second bank that is located between the two pixels of the same color.

In one embodiment, the pixels are arranged so as to include two adjacent pixels of the same color; and the plurality of second banks do not include any second bank that is located between the two pixels of the same color.

In one embodiment, each of the organic EL elements includes a first electrode, an organic EL layer provided on the first electrode, and a second electrode provided on the organic EL layer; and the organic EL layer includes a plurality of print films layered together.

In one embodiment, each of the organic EL elements includes a first electrode, an organic EL layer provided on the first electrode, and a second electrode provided on the organic EL layer; and the organic EL layer includes a plurality of deposition films layered together.

Advantageous Effects of Invention

According to an embodiment of the present invention, it is possible to provide an organic EL display apparatus with which the occurrence of color mixture is suppressed and which can display an image with a high color purity.

DESCRIPTION OF EMBODIMENTS

Embodiments of the present invention will now be described with reference to the drawings. Note that the present invention is not limited to the following embodiments.

Figure 1:
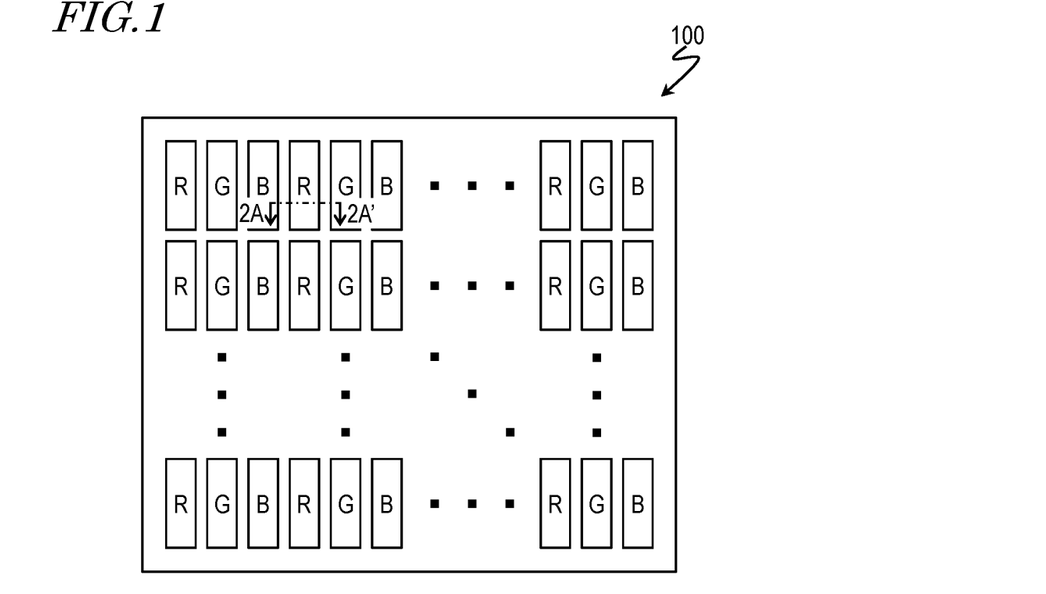
FIG. 1 is a diagram showing a pixel array of an organic EL display apparatus 100 according to an embodiment of the present invention.
Figure 2:
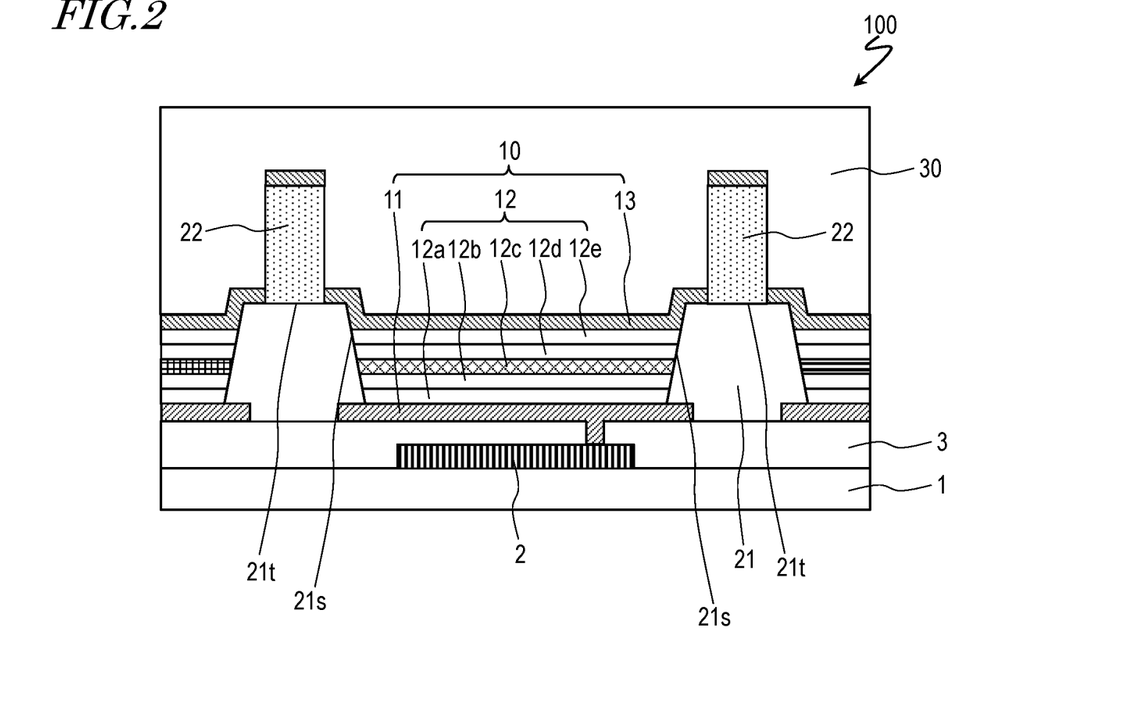
FIG. 2 is a cross-sectional view schematically showing the organic EL display apparatus 100, showing a cross section taken along line 2A-2A' of FIG. 1.

Referring to FIG. 1 and FIG. 2, an organic EL display apparatus 100 of the present embodiment will be described. FIG. 1 is a diagram showing a pixel array of the organic EL display apparatus 100, and FIG. 2 is a cross-sectional view schematically showing the organic EL display apparatus 100, showing a cross section taken along line 2A-2A' of FIG. 1.

As shown in FIG. 1, the organic EL display apparatus 100 includes a plurality of pixels, including red pixels R, green pixels G and blue pixels B. The pixels are arranged in a matrix pattern. One color display pixel is formed by three pixels that display different colors from each other (a red pixel R, a green pixel G and a blue pixel B). Note that although an example where the red pixel R, the green pixel G and the blue pixel B have the same area is illustrated herein, the red pixel R, the green pixel G and the blue pixel B do not have need to have the same area. Although a so-called striped array is illustrated herein, the pixel array is not limited to the striped array.

As shown in FIG. 2, the organic EL display apparatus 100 includes a substrate 1, a driving circuit 2, a plurality of organic EL elements 10, and a thin film encapsulation (TFE) structure 30. The organic EL elements 10 are of a top-emission type, for example. A polarizer may be arranged on the TFE structure 30.

The substrate 1 is a polyimide film, for example. A polyimide film can suitably be used as a flexible substrate 1. Note that a non-flexible substrate (e.g., a glass substrate) may be used as the substrate 1.

The driving circuit (backplane circuit) 2 includes TFTs (not shown herein) formed on the substrate 1. The driving circuit 2 is covered by a flattening film 3.

The organic EL elements 10 are formed on the flattening film 3 and supported by the substrate 1. The organic EL elements 10 are provided in respective pixels. Each organic EL element 10 includes an anode (first electrode) 11, an organic EL layer 12 provided on the anode 11, and a cathode (second electrode) 13 provided on the organic EL layer 12. In the illustrated example, the organic EL layer 12 includes a hole injection layer 12a, a hole transport layer 12b, a light emitting layer 12c, an electron transport layer 12d and an electron injection layer 12e, in this order starting from the anode 11 side. Note that the layered structure of the organic EL layer 12 is not limited to the layered structure illustrated herein. Each of a plurality of organic semiconductor layers of the organic EL layer 12 is herein a film formed by a print method (a print film). That is, the organic EL layer 12 includes a plurality of print films layered together.

The TFE structure 30 has a layered configuration including inorganic barrier layers and organic barrier layers alternating with each other. The specific configuration of the TFE structure 30 may be any of various configurations known in the art.

The organic EL display apparatus 100 further includes a first bank 21 defining a plurality of pixels, and a plurality of second banks 22 provided on a top portion 21t of the first bank 21. The first bank 21 is formed on the flattening film 3. Although the end portion (edge portion) of the anode 11 is located under the first bank 21 in the illustrated example, the end of the anode 11 may be spaced apart from the lower end of the first bank 21. The first bank 21 and the second banks 22 may be formed from a photosensitive resin material, as will be described below.

Figure 3:
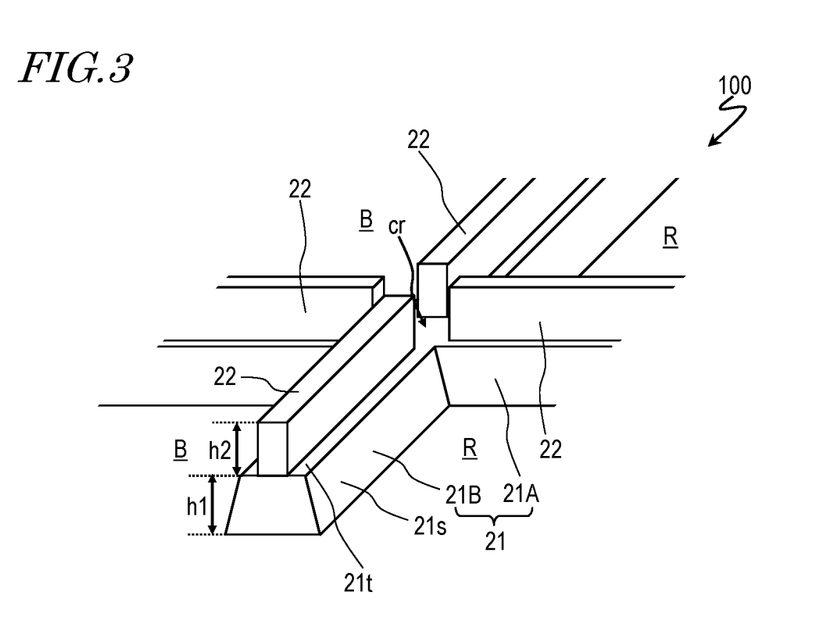
FIG. 3 is a perspective view schematically showing a first bank 21 and second banks 22 of the organic EL display apparatus 100.
Figure 4:
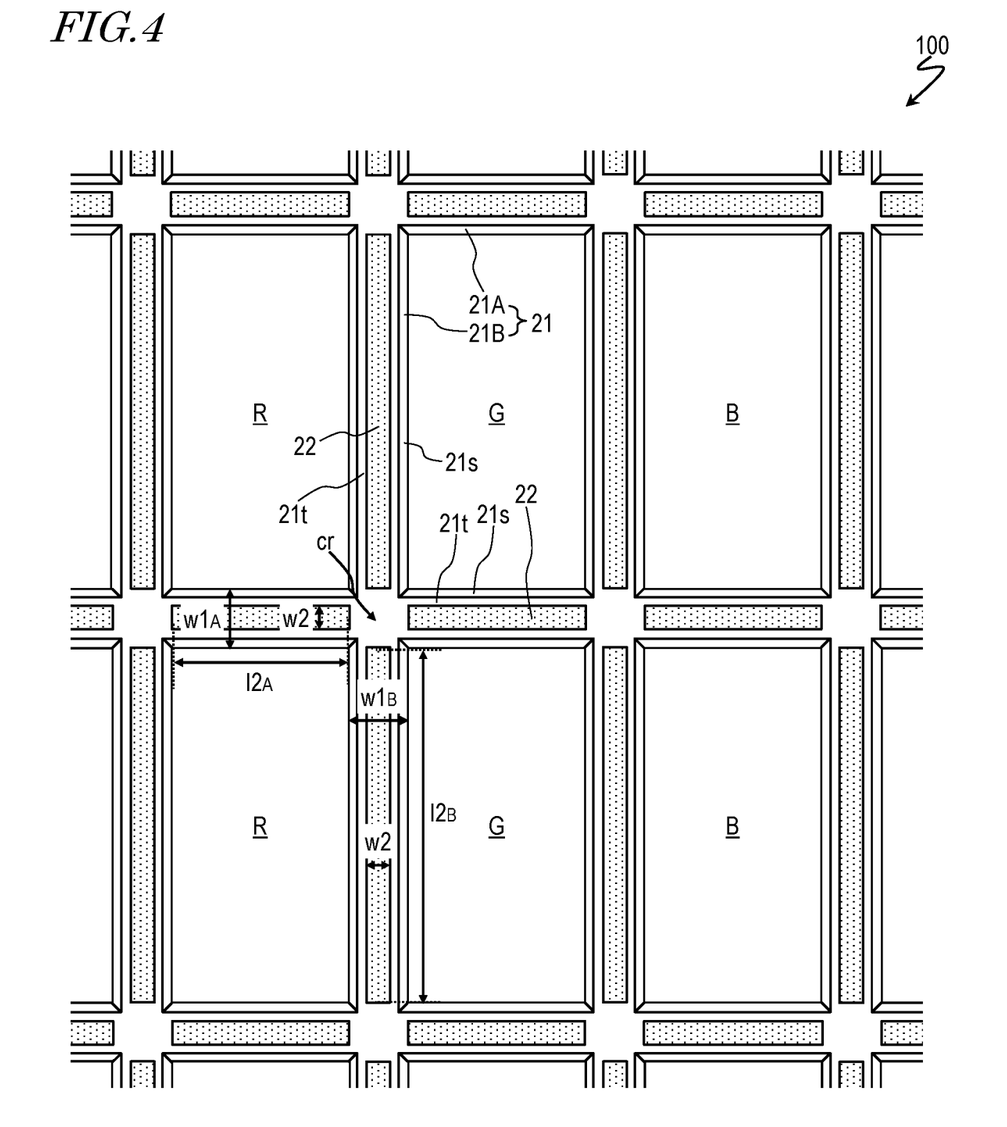
FIG. 4 is a top view schematically showing the first bank 21 and the second banks 22 of the organic EL display apparatus 100.

Hereinafter, referring also to FIG. 3 and FIG. 4, the configuration of the first bank 21 and the second banks 22 will be described. FIG. 3 and FIG. 4 are a perspective view and a top view, respectively, schematically showing the first bank 21 and the second banks 22.

The first bank 21 is generally lattice-shaped, and includes a plurality of portions (hereinafter referred to as "first portions") 21A extending in the row direction (the first direction), and a plurality of portions (hereinafter referred to as "second portions") 21B extending in the column direction (the second direction) that crosses (herein, generally orthogonal to) the row direction. Pixels are individual areas that are surrounded by the first bank 21. The first bank 21 includes the top surface 21t and a side surface 21s having a tapered shape.

Each of the second banks 22 is a generally rectangular parallelepiped. As already described above, the second banks 22 are provided on the top portion (top surface) 21t of the first bank 21. The second banks 22 are not formed at the intersections cr between the first portions 21A and the second portions 21B of the first bank 21. The second banks 22 do not cover the side surface 21s of the first bank 21 and are not in contact with the anode 11.

The second banks 22 are liquid repellent. In contrast, the first bank 21 is not liquid repellent but is lyophilic. That is, the second banks 22 are more liquid repellent than the first bank 21.

Herein, a bank, or the like, being "liquid repellent" means that the surface of the bank, or the like, has a low wettability for a liquid material (an ink for a print method). Specifically, it means that the bank surface at least has water repellency when a hydrophilic (water-dispersible) ink is used, and the bank surface at least has oil repellency when a hydrophobic (organic solvent) ink is used. Also, it means that it has both water repellency and oil repellency when the organic EL layer includes a layer formed from a hydrophilic ink and a layer formed from a hydrophobic ink.

On the other hand, a bank, or the like, being "lyophilic" means that the surface thereof has a high wettability for a liquid material. Specifically, it means that the bank surface at least has hydrophilicity when a hydrophilic ink is used, and the bank surface at least has oleophilicity when a hydrophobic ink is used. Also, it means that it has both hydrophilicity and oleophilicity when the organic EL layer includes a layer formed from a hydrophilic ink and a layer formed from a hydrophobic ink.

Moreover, the phrase "wettability being low" means that the contact angle of the bank surface for a liquid material is 90° or more, for example, and the phrase "wettability being high" means that the contact angle of the bank surface for a liquid material is 40° or less, for example. The contact angle is typically measured by using a sessile drop method.

As described above, with the organic EL display apparatus 100 of the present embodiment, a plurality of second banks 22 that are more liquid repellent than the first bank 21 are provided on the first bank 21. Therefore, when the organic EL layer 12 is formed by a print method during the manufacturing process of the organic EL display apparatus 100, it is possible to prevent an organic material (light emitting layer material) drop-fed into each pixel from leaking out to an adjacent pixel (to prevent a satellite droplet from landing on an adjacent pixel). Therefore, with the organic EL display apparatus 100, the occurrence of color mixture is suppressed, and it is possible to display an image with a high color purity.

The second banks 22 are not formed at the intersections cr of the first bank 21. A study by the present inventors revealed that when the second bank 22 is formed also at the intersections cr of the first bank 21 (i.e., a lattice-shaped second bank 22 is provided), underexposure or patterning defect may occur on the photosensitive resin material provided on the intersections cr, and it is difficult to control the height of the second bank 22 on the intersections. By not forming the second banks 22 at the intersections cr of the first bank 21 as in the present embodiment, it is possible to desirably control the height of the second banks 22.

Note that a conductive layer that forms the cathode 13 of each pixel may become discontinuous due to the step by the second bank 22, as illustrated in FIG. 2, but is continuous over the intersections cr where the second bank 22 is not formed.

Although a case where the organic EL layer 12 is formed by a print-based method is illustrated herein, the embodiment of the present invention can realize the advantageous effects described above even when the organic EL layer 12 is formed by a deposition-based method (i.e., when the organic EL layer 12 includes a plurality of deposition films layered together). The provision of the second banks increases the height of the structure (bank) that partitions between adjacent pixels from each other, thereby making it possible to block an organic material that comes over from adjacent pixels due to shadowing. Thus, it is possible to prevent color mixture.

In the present embodiment, the first bank 21 that is generally lattice-shaped and is not liquid repellent is provided under the second banks 22, and the second banks 22 do not cover the side surface 21s of the first bank 21 (i.e., the side surface 21s of the first bank 21 is exposed). Therefore, an organic material can be neatly applied across the entire area within the pixels. That is, the pixels are defined by the first bank 21.

The material of the first bank 21 may be a non-fluorine non-silicone resin that does not turn liquid repellent, and specifically, an acrylic resin, a polyamide or a polyimide with photosensitivity may desirably be used. A photosensitive polyamide is disclosed in International Publication WO2009/151012 pamphlet, for example.

An acrylic resin or a polyamide with negative photosensitivity may desirably be used as the material of the second banks 22. With a negative photosensitive resin, portions that polymerize through light irradiation increase the resistance against the developer, and portions that have been irradiated with light remain as a pattern after the development. Therefore, the degree of polymerization can be controlled by changing the amount of exposure, etc., thereby enhancing the ability to control the pattern to be left remaining. Thus, since it is possible to perform photolithography with a high precision by using the resin material described above, it is possible to desirably form the second banks 22 on the first bank 21.

If the second banks 22 include a liquid repellent material or if a liquid repellent treatment is performed on the surface of the second banks 22, the second banks 22 can exhibit liquid repellency. The liquid repellent material may be a fluorine-based liquid repellent material, for example. The liquid repellent treatment may be a plasma treatment using a fluorine-based gas such as carbon tetrafluoride ($CF_4$).

The second banks 22 may be colorless or colored. When the second banks 22 are colored (e.g., black or dark brown), it is possible to control the light that comes diagonally out of the pixels, thereby improving the viewing angle characteristic.

There is no particular limitation on the height h1 of the first bank 21 (see FIG. 3). The height h1 of the first bank 21 is 1 μm or more and 2 μm or less, for example.

There is no particular limitation on the width $w1_A$ of the first portion 21A and the width $w1_B$ of the second portion 21B of the first bank 21 (see FIG. 4). The width $w1_A$ of the first portion 21A and the width $w1_B$ of the second portion 21B are set so that the first portion 21A and the second portion 21B overlap with the anode 11 by 1 μm or more and 3 μm or less, for example.

While there is no particular limitation on the height h2 of the second banks 22 (see FIG. 3), it is preferably somewhat large and is preferably 2 μm or more, for example, in order to prevent the occurrence of color mixture. Note however that when the height h2 of the second banks 22 is excessive, it may lead to difficulties in the manufacture, and it is preferably 5 μm or less, for example.

The width w2 of the second banks 22 (see FIG. 4) is set to be smaller than the width of the first bank 21 (the width $w1_A$ of the first portion 21A and the width $w1_B$ of the second portion 21B) by a predetermined amount. Specifically, the width w2 of the second banks 22 is set in view of the alignment precision in the photolithography process for forming the second banks 22 and so that the width of the top portion 21t of the first bank 21 is smaller than the width of the bottom portion thereof ($w1_A$ and $w1_B$ described above), and is set to be smaller than the width of the first bank 21 (the width $w1_A$ of the first portion 21A and the width $w1_B$ of the second portion 213) by 6 μm or more, for example.

The lengths $12_A$ and $12_B$ of the second banks 22 (see FIG. 4) are preferably somewhat large in order to suppress the occurrence of color mixture. Specifically, the length $12_A$ of the second bank 22 on the first portion 21A (a portion extending in the row direction) of the first bank 21 is preferably 80% or more of the length of the pixel along the row direction, and the length $12_B$ of the second bank 22 on the second portion 213 (a portion extending in the column direction) of the first bank 21 is preferably 80% or more of the length of the pixel along the column direction.

Figure 5:
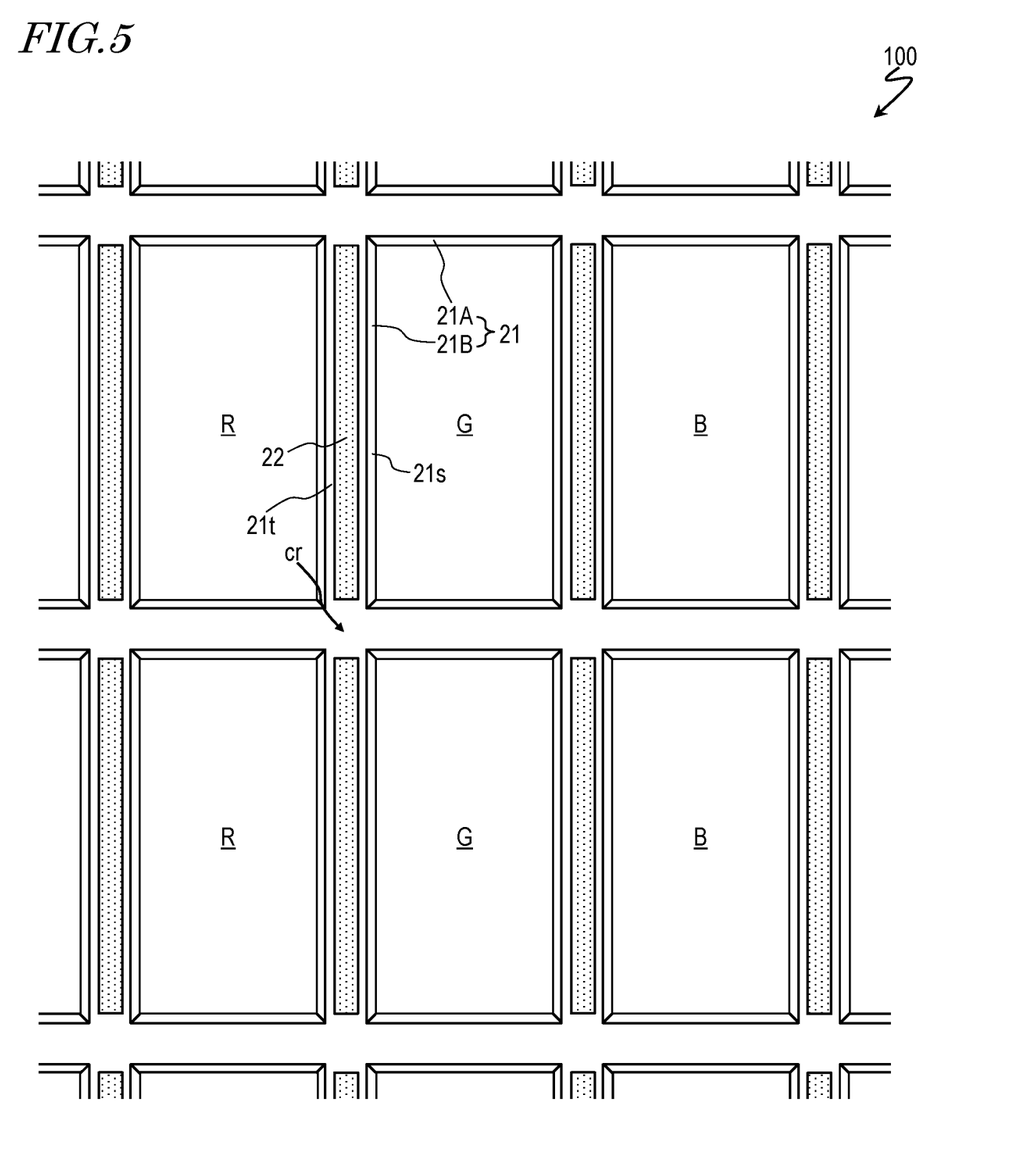
FIG. 5 is a top view schematically showing the first bank 21 and the second banks 22 of the organic EL display apparatus 100.

Note that with the striped array illustrated in FIG. 1, etc., pixels of different colors are adjacent to each other along the row direction and pixels of the same color are adjacent to each other along the column direction. Therefore, the second banks 22 on the first bank 21 include second banks 22 that are located between two pixels of different colors (the second banks 22 on the second portion 213) and second banks 22 that are located between two pixels of the same color (the second banks 22 on the first portion 21A). Since color mixture does not occur between pixels of the same color, second banks 22 that are located between two pixels of the same color may be omitted as shown in FIG. 5.

Next, an example of a TFT used in the driving circuit 2 of the organic EL display apparatus 100 will be described.

A low-temperature polysilicon (abbreviated as "LTPS") TFT or an oxide TFT (e.g., a quaternary (In—Ga—Zn—O-based) oxide TFT including In (indium), Ga (gallium), Zn (zinc) and O (oxygen)) having a high mobility may desirably be used in a high-definition, medium- or small-sized organic EL display apparatus. The structure and the manufacturing method of an LTPS-TFT and an In—Ga—Zn—O-based TFT are well known in the art, and will be described only briefly below.

Figure 6A:
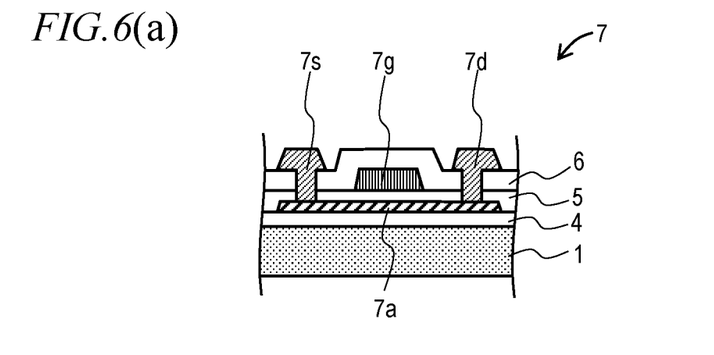
FIGS. 6(a) and 6(b) are cross-sectional views schematically showing an LTPS-TFT 7 and an In—Ga—Zn—O-based TFT 8, respectively, to be used in a driving circuit 2 of the organic EL display apparatus 100.

FIG. 6(a) is a cross-sectional view schematically showing an LTPS-TFT 7. The TFT 7 can be included in the driving circuit 2 of the organic EL display apparatus 100. The TFT 7 is a top-gate TFT.

The TFT 7 is formed on a base coat layer 4 on the substrate (e.g., a polyimide film) 1. The base coat layer 4 is formed from an inorganic insulating material.

The TFT 7 includes a polysilicon layer 7a formed on the base coat layer 4, a gate insulating layer 5 formed on the polysilicon layer 7a, a gate electrode 7g formed on the gate insulating layer 5, an inter-layer insulating layer 6 formed on the gate electrode 7g, and a source electrode 7s and a drain electrode 7d formed on the inter-layer insulating layer 6. The source electrode 7s and the drain electrode 7d are connected to the source region and the drain region, respectively, of the polysilicon layer 7a through contact holes formed in the inter-layer insulating layer 6 and the gate insulating layer 5.

The gate electrode 7g is included in the same gate metal layer as the gate bus line, and the source electrode 7s and the drain electrode 7d are included in the same source metal layer as the source bus line.

Figure 6B:
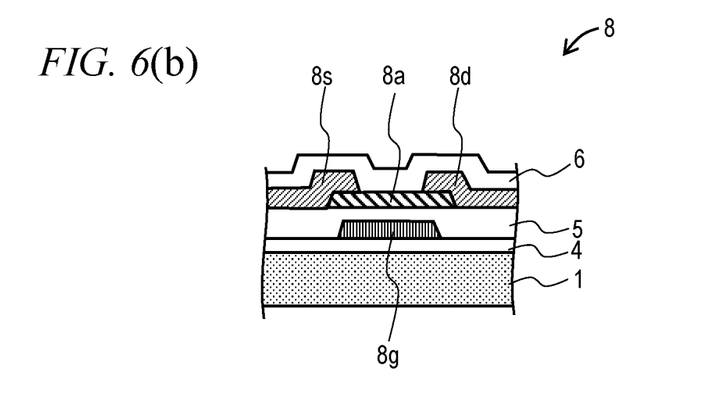

FIG. 6(b) is a cross-sectional view schematically showing an In—Ga—Zn—O-based TFT 8. The TFT 8 can be included in the driving circuit 2 of the organic EL display apparatus 100. The TFT 8 is a bottom-gate TFT.

The TFT 8 is formed on the base coat layer 4 on the substrate (e.g., a polyimide film) 1. The TFT 8 includes a gate electrode 8g formed on the base coat layer 4, the gate insulating layer 5 formed on the gate electrode 8g, an oxide semiconductor layer 8a formed on the gate insulating layer 5, and a source electrode 8s and a drain electrode 8d connected to the source region and the drain region, respectively, of the oxide semiconductor layer 8a. The source electrode 8s and the drain electrode 8d are covered by the inter-layer insulating layer 6. The gate electrode 8g is included in the same gate metal layer as the gate bus line, and the source electrode 8s and the drain electrode 8d are included in the same source metal layer as the source bus line.

Next, a method for manufacturing the organic EL display apparatus 100 will be described. Herein, an example where the driving circuit 2 includes the LTPS-TFT 7 will be described. The organic EL display apparatus 100 can be manufactured as follows, for example.

A polyimide film having a thickness of 10 µm or more and 20 µm or less, for example, is prepared as the substrate 1. The polyimide film is formed on a glass plate. The polyimide film may be a single layer, or may have a two-layer configuration including an inorganic film (an $SiO_2$ film, etc.) sandwiched between two polyimide layers.

A layered inorganic film (e.g., $SiO_2$ film/$SiN_x$ film/$SiO_2$ film) is formed as the base coat layer 4 on the substrate 1.

An a-Si film having a thickness of 50 nm or more and 100 nm or less, for example, is deposited by a plasma CVD method on the base coat layer 4.

The a-Si film is dehydrogenated (e.g., annealed at 450° C. for 180 min).

The a-Si film is polysiliconized by an excimer laser annealing (ELA) method.

The a-Si film is patterned by a photolithography process, thereby forming an active layer (a semiconductor island).

An $SiO_2$ film having a thickness of 100 nm, for example, is deposited by a plasma CVD method as the gate insulating layer 5 covering the active layer.

The channel region of the active layer is doped ($B^+$).

An Mo film having a thickness of 250 nm, for example, is deposited by a sputtering method as a gate metal on the gate insulating layer 5, and the gate metal is patterned by a photolithography process, thereby forming the gate electrode 7g and the gate bus line.

The source region and the drain region of the active layer are doped (Pt).

An activation anneal (e.g., an anneal at 450° C. for 45 min) is performed. Thus, the polysilicon layer 7a is obtained.

An $SiN_x$ film or an $SiO_2$ film having a thickness of 100 nm or more and 300 nm or less, for example, is deposited by a plasma CVD method as the inter-layer insulating layer 6 covering the gate electrode 7g, etc.

Contact holes are formed in the gate insulating layer 5 and the inter-layer insulating layer 6 by wet etching and dry etching.

A layered film of Ti film/Al film/Ti film (thickness: 50 nm/500 nm/100 nm, for example) is deposited by a sputtering method as a source metal on the inter-layer insulating layer 6, and the source metal is patterned by a photolithography process, thereby forming the source electrode 7s, the drain electrode 7d and the source bus line. Thus, the TFT 7 is completed.

A polyimide film or an acrylic resin film having a thickness of 2 µm, for example, is deposited by a slit coater, or the like, as the flattening film 3 so as to cover the TFT 7, etc.

A layered film of ITO film/Ag or APC film/ITO film (thickness: 5 nm/100 nm/5 nm, for example) is deposited and patterned as the anode 11 on the flattening film 3.

The generally lattice-shaped first bank 21 is formed on the flattening film 3. A photosensitive acrylic resin or a polyamide that is not liquid repellent is used as the material of the first bank 21. Alternatively, a polyimide may be used. The height of the first bank 21 is 1 µm or more and 2 µm or less, for example.

A plurality of second banks 22 are formed on the top portion 21t of the first bank 21. The second banks 22 are not formed at the intersections cr of the first bank 21. An acrylic resin or a polyamide with negative photosensitivity is used as the material of the second banks 22. Thus, it is possible to performed a high-precision photolithography process. A fluorine-based liquid repellent material is added to the material of the second banks 22. Alternatively, a liquid repellent treatment (e.g., a plasma treatment using $CF_4$) may be performed on the surface of the second banks 22. The height of the second banks 22 is 2 μm or more and 5 μm or less, for example.

Then, the organic EL layer 12 is formed by a print method or a vacuum deposition method, and then the cathode 13 is formed. Thereafter, the TFE structure 30 is formed on the organic EL element 10.

Thus, the organic EL display apparatus 100 is obtained.

Figure 7:
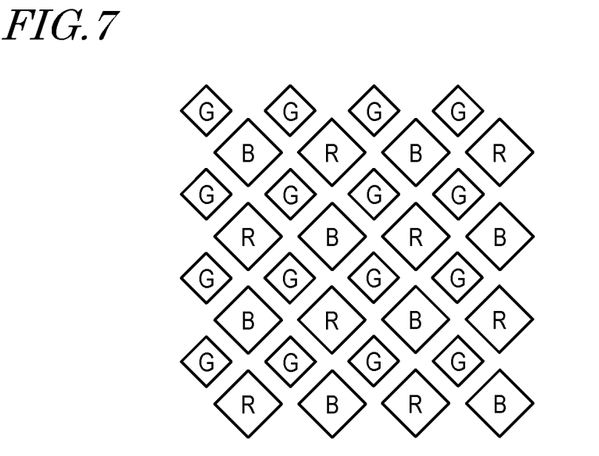
FIG. 7 is a diagram showing another example pixel array (a pentile array).

While a case where the pixel array is a striped array has been illustrated in the description above, the embodiment of the present invention is not limited thereto. The pixel array may be a pentile array as shown in FIG. 7, for example. The pentile array illustrated in FIG. 7 is referred to also as a diamond pentile array.

Figure 8:
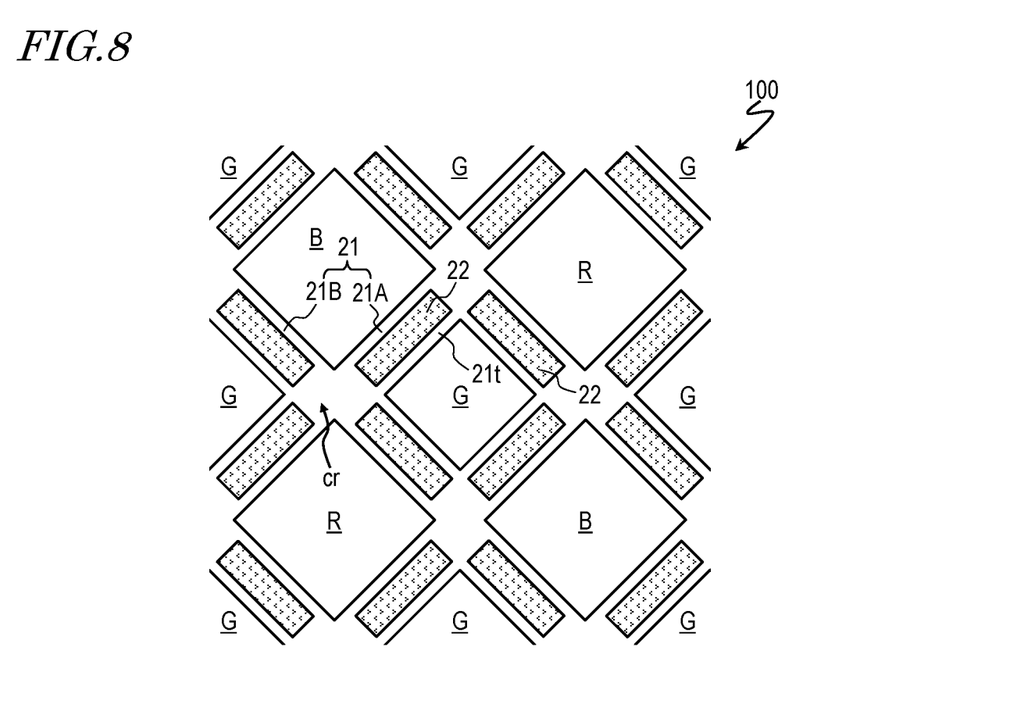
FIG. 8 is a top view schematically showing the first bank 21 and the second banks 22 of an organic EL display apparatus 100A of a pentile array.

FIG. 8 shows a configuration of the first bank 21 and the second banks 22 of the organic EL display apparatus 100A having a diamond pentile array.

When the pixel array is a diamond pentile array, the directions in which the first portions 21A and the second portions 21B of the first bank 21 extend are different by about 45° from those of a striped array, as shown in FIG. 8. Also with this configuration, by providing the second banks 22 that are more liquid repellent than the first bank 21 on the top portion 21t of the first bank 21, it is possible to realize similar advantageous effects.

INDUSTRIAL APPLICABILITY

According to the embodiment of the present invention, the occurrence of color mixture is suppressed, and it is possible to provide an organic EL display apparatus which can display an image with a high color purity. The embodiment of the present invention can be desirably used in high-definition organic EL display apparatuses.

REFERENCE SIGNS LIST

1: Substrate, 2: Driving circuit, 3: Flattening film, 7: LTPS-TFT, 8: In—Ga—Zn—O-based TFT, 10: Organic EL element, 11: Anode, 12: Organic EL layer, 12a: Hole injection layer, 12b: Hole transport layer, 12c: Light emitting layer, 12d: Electron transport layer, 12e: Electron injection layer, 13: Cathode, 21: First bank, 21A: First portion of first bank, 21B: Second portion of second bank, 21t: Top portion (top surface) of first bank, 21s: Side surface of first bank, 22: Second bank, 30: TFE structure, 100: Organic EL display apparatus, R: Red pixel, G: Green pixel, B: Blue pixel, cr: Intersection of first bank

The invention claimed is:

1. An organic EL display apparatus having a plurality of pixels including red pixels, green pixels and blue pixels, the apparatus comprising:
   a substrate;
   a plurality of organic EL elements supported on the substrate, with one organic EL element provided in each pixel;
   a generally lattice-shaped first bank defining the pixels, the first bank including a plurality of first portions extending in a first direction and a plurality of second portions extending in a second direction that crosses the first direction; and
   a plurality of second banks provided on a top portion of the first bank, wherein the plurality of second banks are not formed at intersections between the first portions and the second portions of the first bank,
   wherein the plurality of second banks includes:
   a second bank that is located on each of the plurality of first portions of the first bank and has a length of 80% or more of a length of the pixel along the first direction, and
   a second bank that is located on each of the plurality of second portions of the first bank and has a length of 80% or more of a length of the pixel along the second direction, and
   wherein a top portion of each of the plurality of second banks is substantially flat.

2. The organic EL display apparatus of claim 1, wherein:
   the first bank includes a side surface having a tapered shape; and
   the plurality of second banks do not cover the side surface of the first bank.

3. The organic EL display apparatus of claim 1, wherein the plurality of second banks are colored.

4. The organic EL display apparatus of claim 1, wherein the first bank is formed from a non-fluorine non-silicone resin.

5. The organic EL display apparatus of claim 4, wherein the first bank is formed from an acrylic resin, a polyamide or a polyimide with photosensitivity.

6. The organic EL display apparatus of claim 1, wherein the plurality of second banks are formed from an acrylic resin or a polyamide with negative photosensitivity.

7. The organic EL display apparatus of claim 1, wherein the plurality of second banks include a liquid repellent material, or a liquid repellent treatment is performed on a surface thereof.

8. The organic EL display apparatus of claim 1, wherein the plurality of second banks include a second bank that is located between two adjacent pixels of different colors.

9. The organic EL display apparatus of claim 8, wherein:
   the pixels are arranged so as to include two adjacent pixels of the same color; and
   the plurality of second banks include a second bank that is located between the two pixels of the same color.

10. The organic EL display apparatus of claim 1, wherein:
    each of the organic EL elements includes a first electrode, an organic EL layer provided on the first electrode, and a second electrode provided on the organic EL layer; and
    the organic EL layer includes a print film.

11. The organic EL display apparatus of claim 1, wherein:
    each of the organic EL elements includes a first electrode, an organic EL layer provided on the first electrode, and a second electrode provided on the organic EL layer; and
    the organic EL layer includes a plurality of deposition films layered together.

12. The organic EL display apparatus of claim 1, wherein a height of the second bank is greater than or equal to a height of the first bank.

* * * * *